(12) United States Patent
Lin et al.

(10) Patent No.: US 7,531,843 B2
(45) Date of Patent: May 12, 2009

(54) STRUCTURE OF AC LIGHT-EMITTING DIODE DIES

(75) Inventors: Ming-Te Lin, Hsinchu (TW); Fei-Chang Hwang, Hsinchu (TW); Chia-Tai Kuo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 174 days.

(21) Appl. No.: 10/994,361

(22) Filed: Nov. 23, 2004

(65) Prior Publication Data

US 2006/0044864 A1 Mar. 2, 2006

(30) Foreign Application Priority Data

Aug. 31, 2004 (TW) .............................. 93126201 A

(51) Int. Cl.
*H01L 29/201* (2006.01)
*H01L 29/225* (2006.01)
(52) U.S. Cl. .............................. 257/90; 257/88; 257/89; 257/97; 257/99; 257/778; 257/706
(58) Field of Classification Search .................. 257/88, 257/97, 99, 90, 778, E33.054, 706, 89, E21.121, 257/E33.012, E33.061
See application file for complete search history.

(56) References Cited

U.S. PATENT DOCUMENTS

| | | | |
|---|---|---|---|
| 5,936,599 A | 8/1999 | Reymond | |
| 6,412,971 B1 | 7/2002 | Wojnarowski et al. | |
| 6,547,249 B2 | 4/2003 | Collins, III et al. | |
| 6,635,902 B1 | 10/2003 | Lin | |
| 7,009,199 B2 * | 3/2006 | Hall | ............................. 257/14 |
| 7,064,353 B2 * | 6/2006 | Bhat | ............................. 257/79 |
| 2004/0075399 A1 * | 4/2004 | Hall | ............................. 315/291 |
| 2004/0080941 A1 | 4/2004 | Jiang et al. | |
| 2004/0227148 A1 * | 11/2004 | Camras et al. | .................. 257/99 |
| 2006/0180818 A1 * | 8/2006 | Nagai et al. | .................... 257/89 |

FOREIGN PATENT DOCUMENTS

| | | |
|---|---|---|
| JP | 4-174567 * | 6/1992 |
| JP | 2002-359402 | 12/2002 |
| JP | 2004-006582 | 1/2004 |
| JP | 2004-079867 | 3/2004 |
| KR | 10-2004-0032360 | 4/2004 |
| TW | 200408148 | 5/2004 |

* cited by examiner

*Primary Examiner*—Kenneth A Parker
*Assistant Examiner*—Joseph Nguyen
(74) *Attorney, Agent, or Firm*—Rabin & Berdo, P.C.

(57) ABSTRACT

A structure of light-emitting diode (LED) dies having an AC loop (a structure of AC LED dies), which is formed with at least one unit of AC LED micro-dies disposed on a chip. The unit of AC LED micro-dies comprises two LED micro-dies arranged in mutually reverse orientations and connected with each other in parallel, to which an AC power supply may be applied so that the LED unit may continuously emit light in response to a positive-half wave voltage and a negative-half wave voltage in the AC power supply. Since each AC LED micro-die is operated forwardly, the structure of AC LED dies also provides protection from electrical static charge (ESD) and may operate under a high voltage.

6 Claims, 12 Drawing Sheets

STRUCTURE OF AC LIGHT-EMITTING DIODE DIES

BACKGROUND OF THE INVENTION

1. Field of Invention

The invention relates to a structure of light-emitting diodes (LED), and particularly to a structure of LED dies with an alternating current (AC) loop (a structure of AC LED dies).

2. Related Art

A light-emitting diode (LED) emits light based on its semi-conductive characteristics, in contrast to the heating light-emitting principle of a fluorescent lamp, and is thus called a cold light. The LED provides a number of advantages such as high endurance, long lifetime, compactness, low power consumption and so forth. Furthermore, no pernicious material such as mercury is contained in the LED. Therefore, there are high expectations with respect to the LEDs for being a light source in daily life in the current lighting market.

However, prior LEDs are generally limited in their acceptable power levels. Most LEDs may be fed with only low DC voltages and may be damaged if high voltages or AC voltages are applied thereon. Because of this, a DC voltage conversion circuit is generally used to transform the external power supply used by such LEDs. In operating an LED by use of a low DC voltage, the LED has its characteristic curve of the current-voltage relation, as shown in FIG. 1A. As shown, when the voltage is forwardly applied, the LED is conducted and light is emitted there from. On the other hand, if a reverse voltage is applied, the LED breaks down and no light is emitted. Further, in practical usage the LED is often connected in series or parallel with several such LEDs, such as those used in traffic light apparatuses such as stop light apparatuses. As shown in FIG. 2, the externally supplied AC voltage 11 is first reduced in its level by means of a conversion circuit 12 and then converted into a DC voltage corresponding thereto. Then the converted DC voltage is fed into a plurality of LEDs connected with one another in series or in parallel as mentioned above, in which LEDs cannot be used when reverse power is supplied.

However, once a single LED arranged among the plurality of LEDs is damaged, the set of LEDs in which the damaged LED resides is also likely to become damaged and the whole of the loop formed with the damaged LED included is badly affected. To reduce this occurrence, the number of LEDs connected in series is generally reduced as much as possible. Unfortunately, the total amount of wires used for these LEDs in a specific application is unavoidably increased and the power consumption increases correspondingly. Furthermore, the voltage at an end of one of the wires is insufficient and thus causes uneven luminance of the LEDs.

There is another serious problem with a low DC voltage operated ALInGaN LED. When such a LED is assembled and processed, electrical static discharge (ESD) is apt to occur. When this occurs, an instantaneous high reverse voltage is burst forth and the LED is damaged.

To resolve the above-mentioned shortcomings, circuit assembly and die manufacturing are two generally adopted solutions.

The circuit assembly scheme may be seen in U.S. Pat. No. 6,547,249. This patent discloses an additional diode arranged in a reverse orientation and connected in parallel to protect an LED-based circuit to prevent sudden ESD or an exceptional current or voltage attack. In another U.S. Pat. No. 5,936,599, LEDs in an LED based circuit are arranged in a reverse orientation and connected in parallel, and inductors and capacitors are introduced in the circuit. In this case, an AC voltage and a high voltage may be used by the LEDs. However, although the problem of high power consumption may be overcome by such circuit assembly schemes, the corresponding large volume of the LED based circuit considerably limits its actual applicable range. In US publication patent 2004/0075399, the circuit is arranged in the submount and formed dies/die array thereon. However, the pitch between conductors for connecting dies and the submount is about 0.1 mm to 0.12 mm. There are only 12*2 diodes in 1 mm*1 mm die. The volume of the die is also great to operate with higher voltage, and the illuminating area is decreased due to the pitch requirement.

An example of the die manufacturing scheme may be seen in U.S. Pat. No. 6,547,249, in which LED dies are manufactured as a matrix form and connections of the LED dies are arranged in the same orientation in series and in parallel. Although such LEDs may be operated with a high voltage, they may still not be applied with an AC voltage. In this patent, an arrangement for protection of breakdown of the LEDs is also provided by connecting a diode with the LEDs in a variety of combinations where the LEDs may also be arranged in mutually reverse orientations and connected with each other but should be disposed over a submount and then connected with the LED matrix in parallel. According to this patent, the LED die 91 has a structure shown in FIG. 1B, and has an equivalent circuit shown in FIG. 1C, in which the LED 91 is connected in parallel with two mutually oriented Zener diodes 92 and 93, or a connection may be provided to form a loop as shown in FIG. 1D. The current-voltage relation curves corresponding to the equivalent circuits in FIG. 1C and FIG. 1D are shown in FIG. 1E and FIG. 1F respectively.

Also referring to U.S. Pat. No. 6,635,902, the LED dies are also manufactured as a matrix form while the LEDs are oriented the same and connected in series. Although the LEDs may be operated with a high voltage, they also have the problem of not being capable of operation with AC voltage.

SUMMARY OF THE INVENTION

An object of the invention is therefore to provide a structure of light-emitting diode (LED) dies having an alternating current (AC) loop abbreviated as a structure of AC LED dies, on which an AC power supply may be applied directly to considerably broaden applicable range.

To achieve the above object, the structure of AC LED dies according to the invention is formed with at least one unit of AC LED micro-dies disposed on a chip. The unit of AC LED micro-dies comprises two LED micro-dies arranged in mutually reverse orientations and connected by a conductive bridge with each other in parallel, to which an AC power supply may be applied so that the unit of AC LED micro-dies continuously emits light in response to a positive-half wave voltage and a negative-half wave voltage in the AC power supply respectively. Since each AC LED micro-die is operated forwardly, the structure of the AC LED dies also provides protection from electric static charge (ESD) and may operate under a high voltage. The pitch is decreased by the conductive bridge to 0.015 mm, 0.012 mm, and 1.010 mm or even to lower than 0.06 mm. Hence, when the size of the die is 1 mm or 0.6 mm, there would have 47*2 diodes and operate with 158 bi-directional voltages.

In practical usage, the structure of the AC LED dies may be provided in a flipped form or a faced-up form. Also, each of the LED dies in the structure of the AC LED dies may correspond to the same wavelength or different wavelengths with those of the other LEDs in the unit of AC LED dies. Thus the structure of AC LED dies may be used in a wider applicable range.

The objects, constructions, features and functions of the invention may be better understood through the following detailed description with respect to the preferred embodiments thereof in connection with the accompanying drawings.

DETAILED DESCRIPTION OF THE INVENTION

Figure 1A:
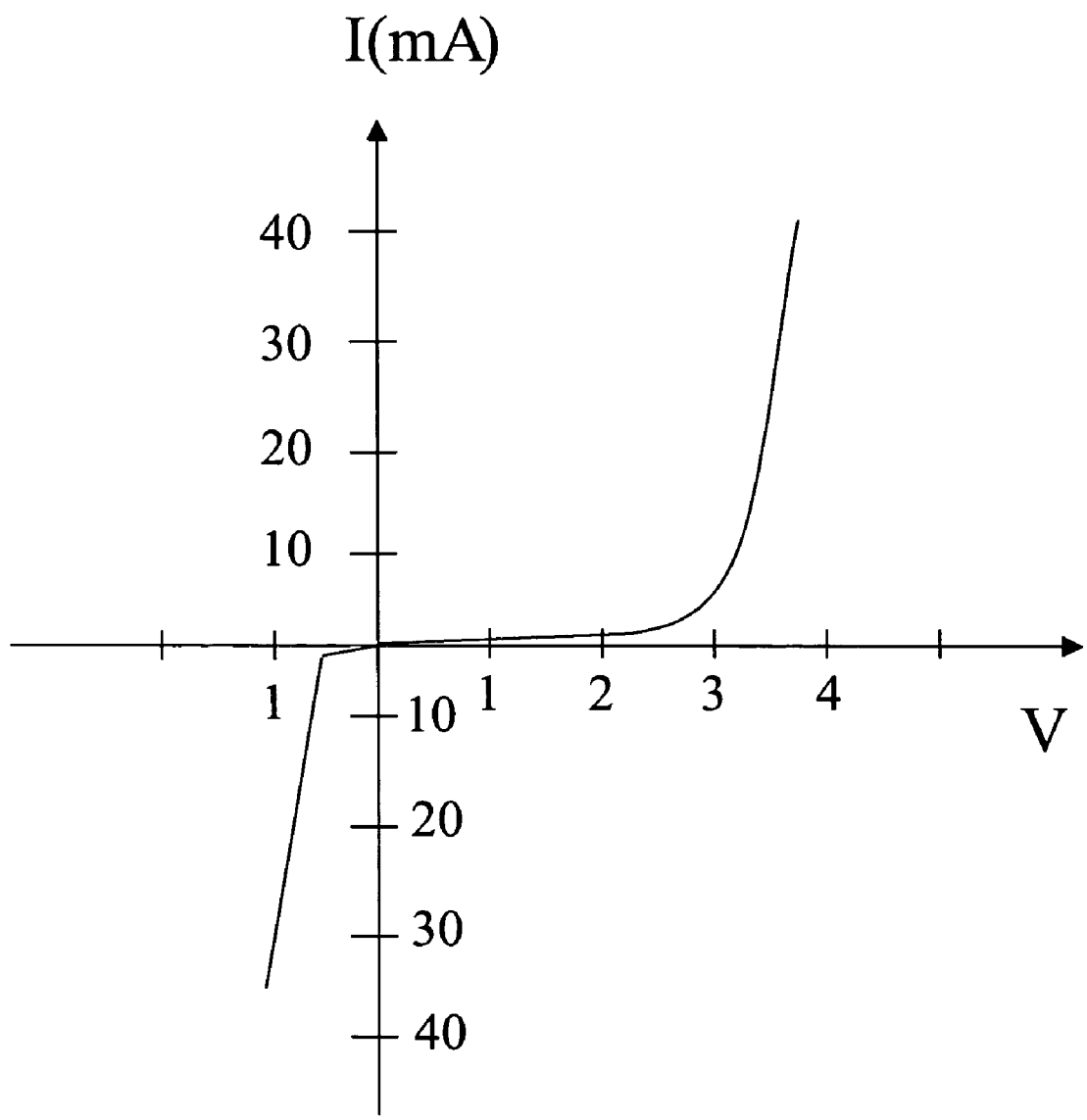
FIG. 1A is a characteristic curve diagram of a prior light-emitting diode (LED) die.
Figure 1B:
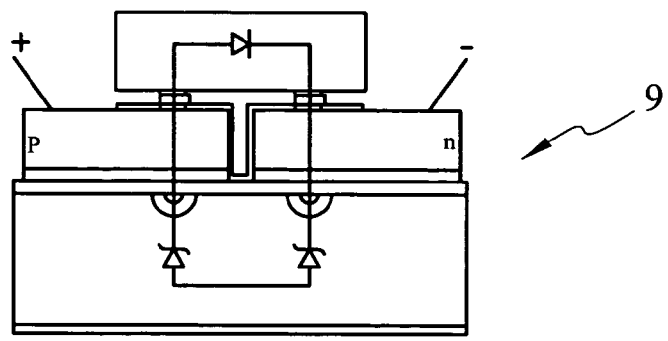
FIGS. 1B-1D are schematic illustrations of a prior LED die-produced by Lumileds.
Figure 1C:
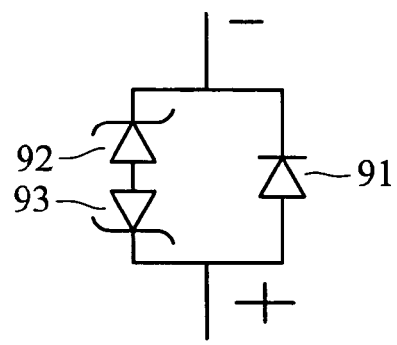
Figure 1D:
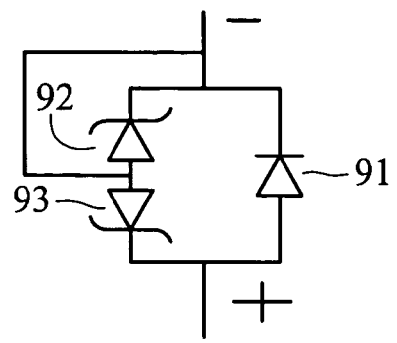
Figure 1E:
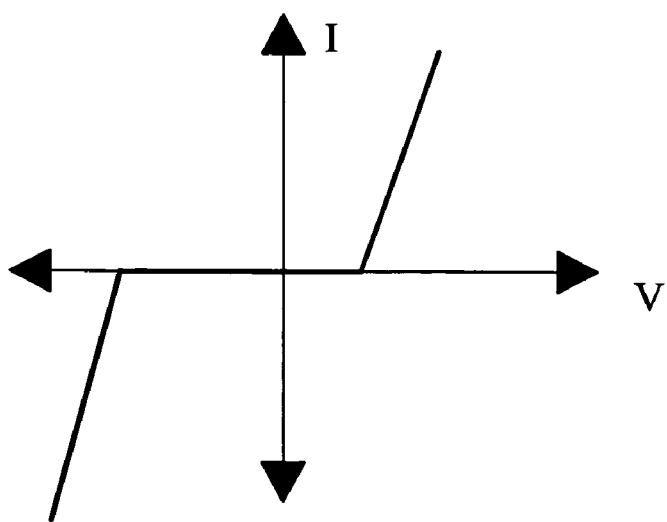
FIGS. 1E-1F are characteristic curve diagrams of the LED die shown in FIGS. 1B-1D.
Figure 1F:
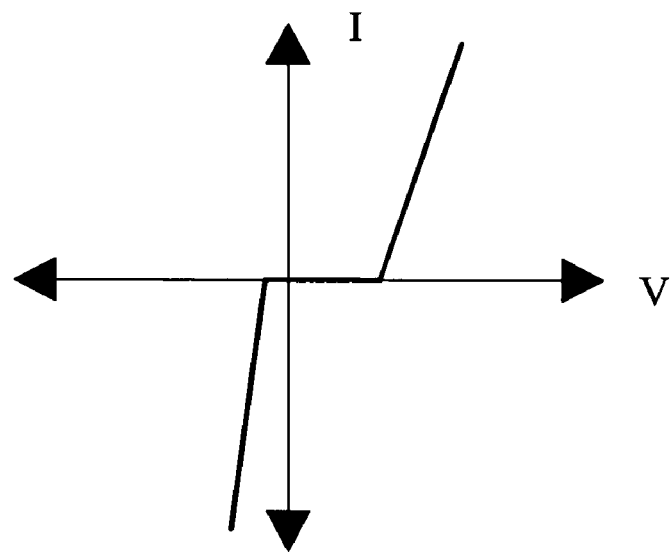
Figure 2:
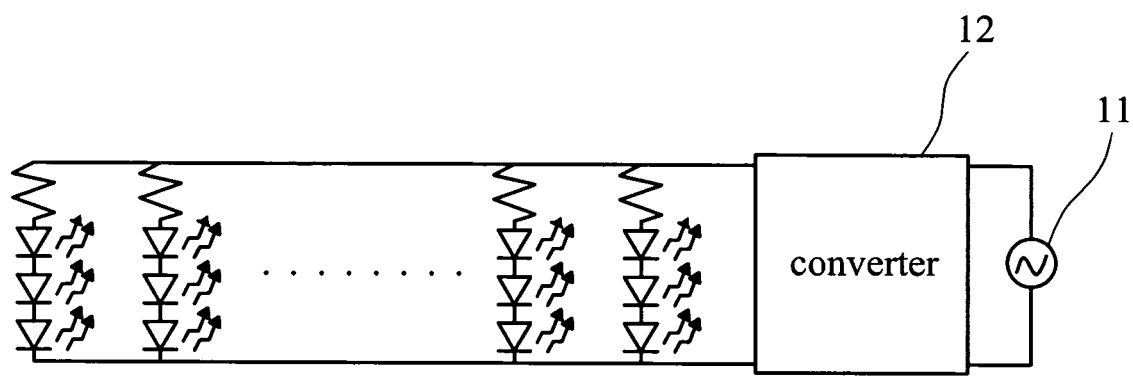
FIG. 2 is an illustration of the prior LED in use.
Figure 3:
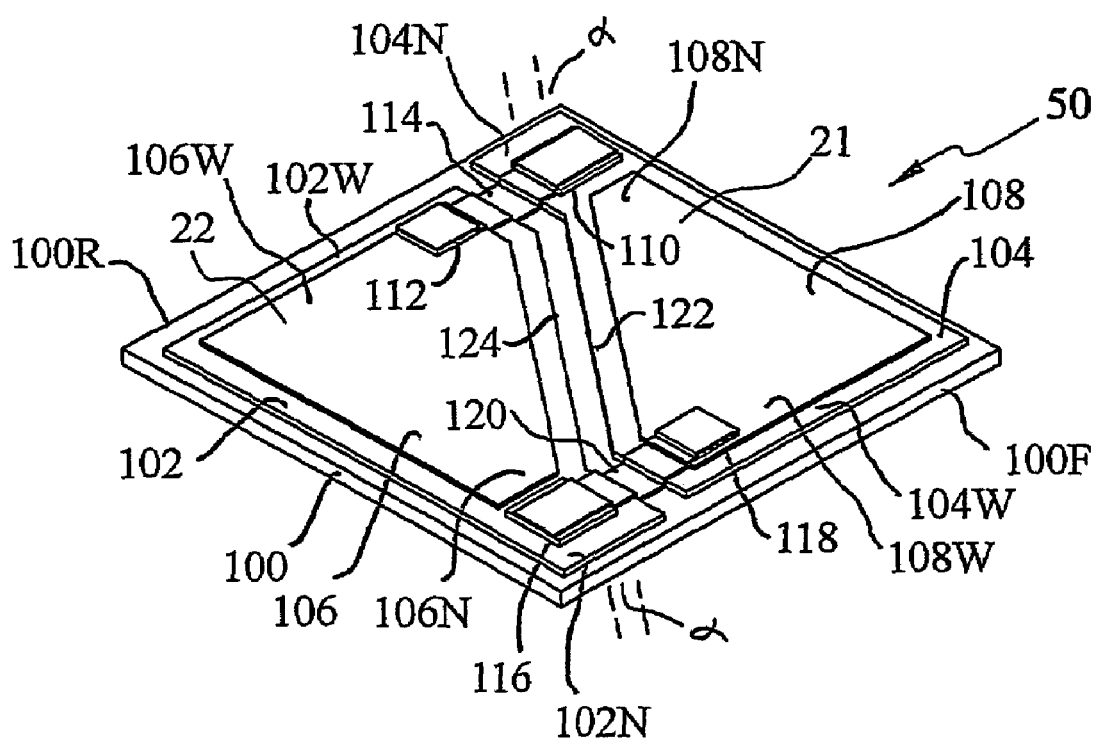
FIG. 3 is a schematic diagram of a structure of LED dies having an alternating current (AC) loop (a structure of AC LED die) according to the invention.
Figure 4A:
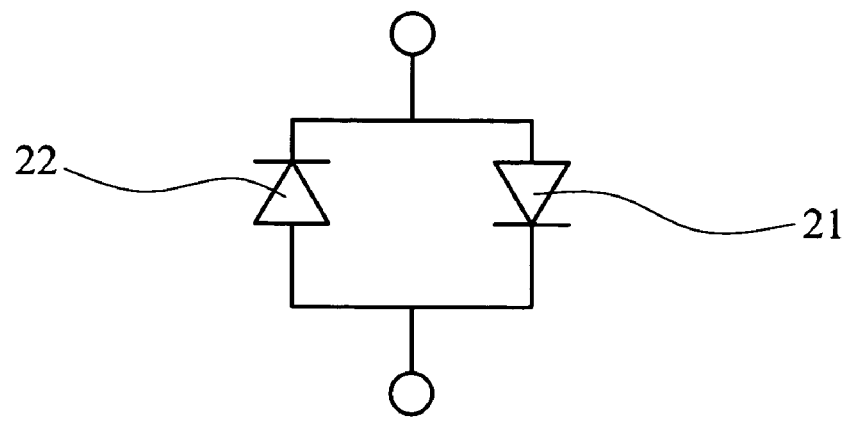
FIG. 4A is an equivalent circuit diagram of the structure of AC LED dies shown in FIG. 3.

A structure of light-emitting diode (LED) dies having an alternating current (AC) loop, which may be fed with a direct AC power supply, is disclosed in the invention (abbreviated as a structure of AC LED dies). The structure of AC LED dies comprises at least a unit 50 of AC LED micro-dies, which will be described in the following. Referring to FIG. 3, the unit of AC LED micro-dies comprises a first LED micro-die and a second LED micro-die 21 and 22 arranged in mutually reverse orientations and connected in parallel. The unit of AC LED micro-dies has an equivalent circuit as shown in FIG. 4A. Since the first and second LED micro-dies 21 and 22 are oriented reversely and connected in parallel, the first LED micro-die 21 emits light when a positive-half wave voltage in the AC power supply is applied, while the second LED micro-die 22 emits light when a negative-half wave voltage in the AC power supply is applied. Therefore, the unit of LED micro-dies may emit light continuously whenever a proper AC power supply is provided. For this reason, the above-mentioned terms "AC loop", "AC LED dies" and "AC LED micro-dies" are used.

With continuing reference to FIG. 3, the first LED micro-die 21 and the second LED micro-die 22 of the unit 50 are formed on a rectangular chip 53 and have shapes that complement each other, so that the LED micro-dies 21 and 22 together cover most of a substantially rectangular region. The first LED micro-die 21 has a first edge 510, a first anode 512 and a first cathode 514. The first anode 512 and the first cathode 514 are disposed adjacent the opposite ends of the first edge 510. The second LED micro-die 22 has a second edge 520, a second anode 522 and a second cathode 524. The second anode 522 and the second cathode 524 are disposed adjacent the opposite ends of the second edge 520. The second edge 520 corresponds to the first edge 510. The second anode 522 corresponds to the first cathode 514 and is electrically connected to the first cathode 514 by a first conductive bridge 54. The second cathode 524 corresponds to the first anode 512 and is electrically connected to the first anode 512 by a second conductive bridge 524.

The chip 53 has four edges 530, 532, 534, and 536. The angles between the edges 530 and 534 and the first edge 510 are acute angles. The angles between the edges 530 and 534 and the second edge 520 are likewise acute angles.

As is shown in FIG. 3, the unit 50 of micro-dies is fabricated on a substrate 100. Two layers 102 and 104 of a first conductivity type are supported on the substrate and separated from each other. The layer 102 has a wide end 102W and a narrow end 102N. Similarly, the layer 104 has a wide end 104W and a narrow end 102N. Two layers 106 and 108 of a second conductivity type are supported respectively on the two layers 102 and 104 with the first conductivity type. Like the layers 102 and 104, the layers 106 and 108 have wide ends (106W and 108W) and narrow ends (106N and 108N). A rear pad 110 is formed on the layer 104 of the first conductivity type, adjacent its narrow end 104N. A rear pad 112 is formed on the layer 106 of the second conductivity type, adjacent its wide end 106W. A rear conductive bridge 114 connects the rear pads 110 and 112. A front pad 116 is formed on the layer 102 of the first conductivity type, adjacent its narrow end 102N. A front pad 118 is formed on the layer 108 of the second conductivity type, adjacent its end 108W. A front bridge 120 connects the front pads 116 and 118.

As is also shown in FIG. 3, the substrate 100 is rectangular and has two pairs of parallel sides, including front and rear parallel sides 100F and 100R. The micro-die 21 has an edge 122, and an anode (at pad 118) and a cathode (at pad 110) disposed adjacent opposite ends of the edge 122. As FIG. 3 illustrates, the micro-dies 21 and 22 complement each other in shape so as to occupy a substantially rectangular region. The micro-die 22 has an edge 124 and an anode (at pad 112) and cathode (at pad 116) disposed adjacent opposite ends of the edge 124. The anode of the micro-die 22 corresponds to and is electrically connected with the cathode of the micro-die 21, via the rear conductive bridge 114. Similarly, the cathode of the micro-die 22 corresponds to and is electrically connected with the anode of the micro-die 21, via the front conductive bridge 120. The edge 122 is disposed at an acute angle α (illustrated with the aid of a dotted line) to the front and rear edges 100F and 100R. Similarly, the edge 124 is disposed at an acute angle (corresponding to the angle α and illustrated with the aid of a dotted line, but not marked with a reference character in order to avoid cluttering the drawing) with respect to the front and rear edges 100F and 100R.

Figure 4B:
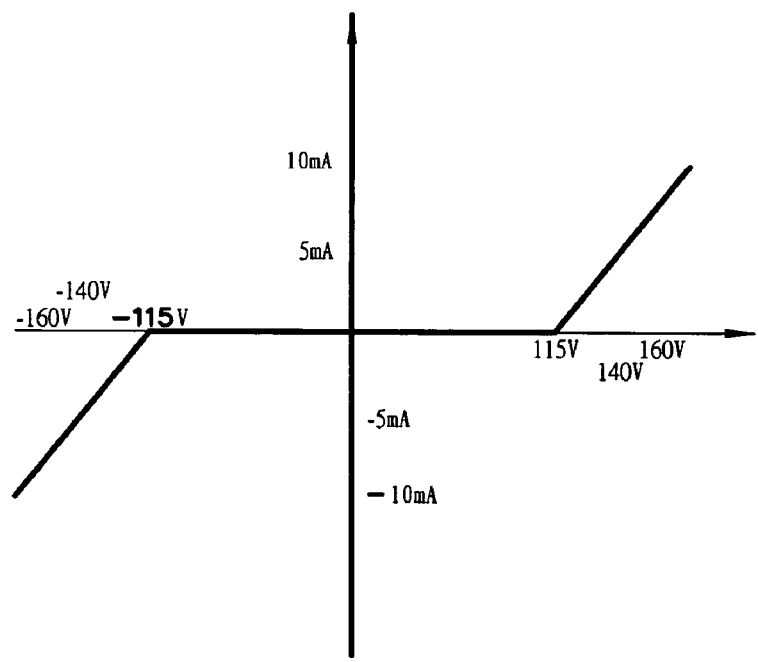
FIG. 4B is a characteristic curve diagram of the structure of AC LED dies shown in FIG. 3.

Furthermore, the characteristic curve associated with the current-voltage relation of the unit of AC LED micro-dies is provided in FIG. 4b. Since each LED micro-die in the unit is operated forwardly, the structure of AC LED dies also provides protection from electric static charge (ESD) without the need of an additional circuit, as in the prior art, or a diode fixed on a sub-mount and connected with the LEDs, as in U.S. Pat. No. 6,547,249. Therefore, the purpose of cost saving may be achieved.

Figure 5:
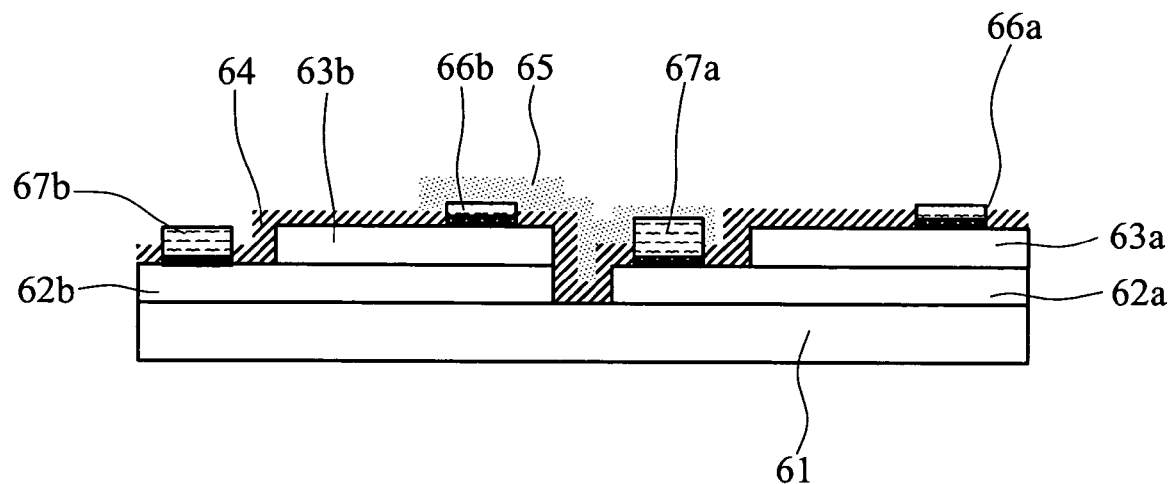
FIG. 5 is a schematic diagram describing a manufacturing of the structure of AC LED dies.
Figure 6:
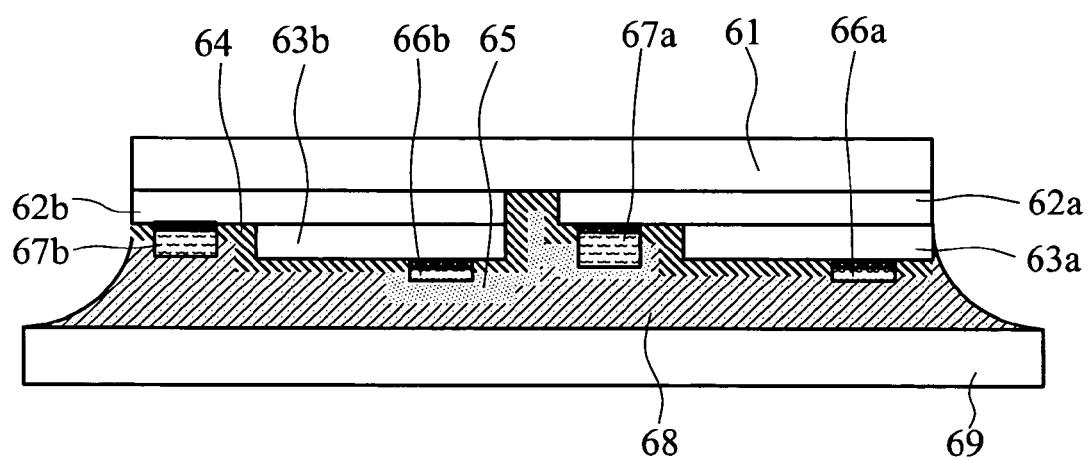
FIG. 6 is a schematic diagram illustrating a package of the structure of AC LED dies shown in FIG. 3.

FIG. 5 illustrates the manufacturing of the structure of AC LED dies. First, two unconnected n-type light-emitting layers 62a and 62b, such as a n-InGaN layer, are first formed on a substrate 61 made of $Al_2O_3$, GaAs, GaP or SiC, etc. Next, two p-type light-emitting layers 63a and 63b, such as an p-InGaN layer, are formed on portions of the n-type light-emitting layers 62a and 62b respectively. Next, n-type pads 67a and 67b are formed on other portions of the n-type light-emitting layers 62a and 62b respectively. Then, p-type pads 66a and 66b are formed on the p-type light-emitting layers 63a and 63b respectively. Then a conductive bridge 65 is formed to connect the n-type pad 67a and the p-type pad 66b, and an insulating layer 64 is formed to avoid short-circuiting between the n-type pad 67a, the p-type pad 66b and the conductive bridge 65. Finally, the p-type pad 67b is connected to the n-type pad 66a.

Figure 12A:
FIGS. 12A-12F are illustrations of a process flow of the manufacturing of the structure of AC LED dies according to the invention.
Figure 12B:
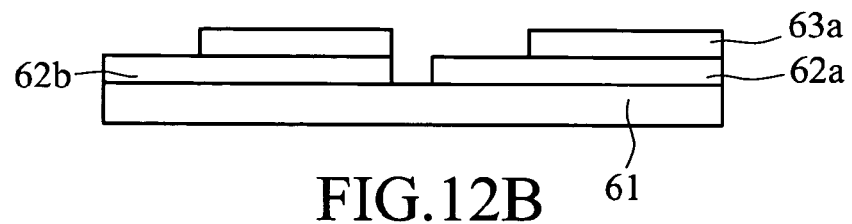
Figure 12C:
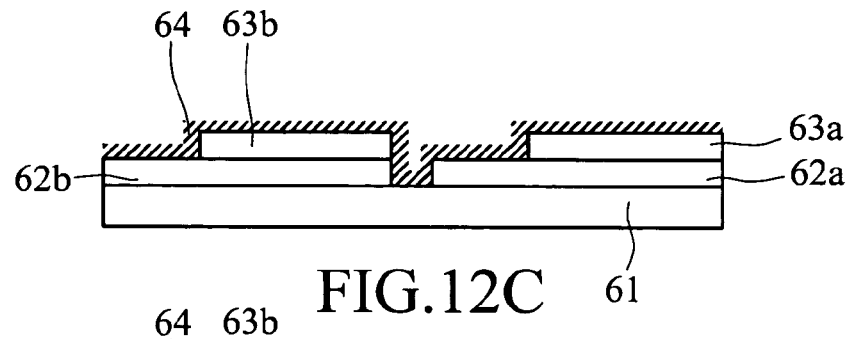
Figure 12D:
Figure 12E:
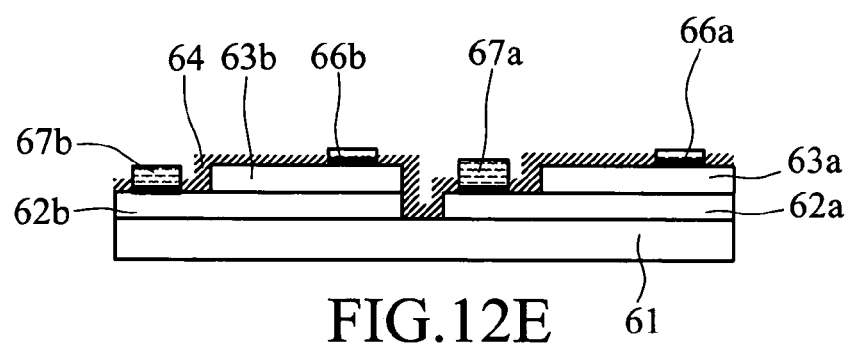
Figure 12F:
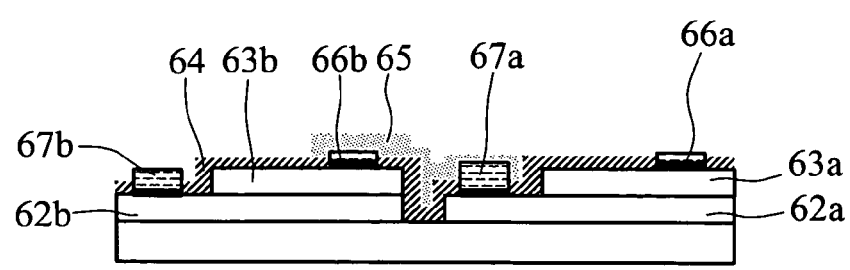

Specifically, the manufacturing of the structure of AC LED dies is illustrated as follows with reference to FIGS. 12A-12F. First, a substrate 61 is provided. On the substrate 61, n-type light-emitting layers 62a and 62b and p-type light-emitting layers 63a and 63b are provided (from bottom to top), as shown in FIG. 12A. Next, an etching operation is performed upon a portion of each of the p-type light-emitting layers 63a and 63b, and a corresponding portion of each of the n-type light-emitting layers 62a and 62b is thus exposed, as shown in FIG. 12B. Next, an insulating layer 64 is formed, as shown in FIG. 12C. The insulating layer 64 may be an oxide layer, for example. Thereafter, specific portions defined for formation of pads in the n-type light-emitting layers 62a and 62b and p-type light-emitting layers 63a and 63b are etched, as shown in FIG. 12D. Then, n-type pads 67a and 67b and p-type pads 66a and 66b are formed at their defined regions as mentioned, as shown in FIG. 12E. Finally, a conductive bridge 65 is formed and connected between the n-type pad 67a and p-type pad 66b, as shown in FIG. 12F.

Figure 7:
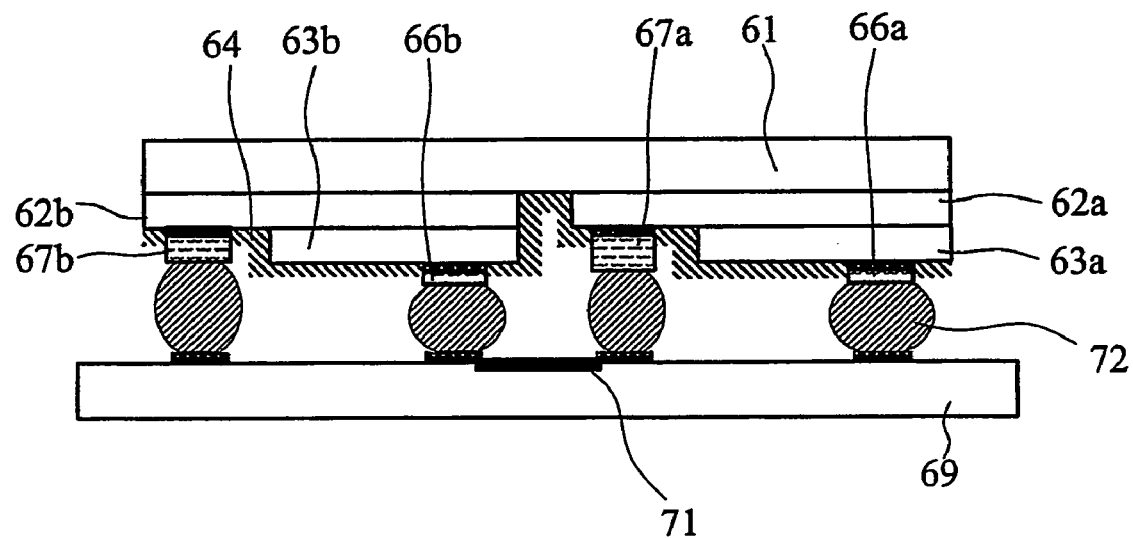
FIGS. 7A and 7B are a schematic diagram illustrating a flip-chip structure of the AC LED dies shown in FIG. 3.

In addition, the structure of AC LED dies may be covered by a glue as a packaged structure and fixed on a sub-mount 69, wherein the glue may be a heatsink glue and the sub-mount 69 may be formed with a surface that acts as a reflective layer to reflect light. Alternatively, bumps 72 may be formed over the sub-mount 69. Trace 71 are used to connect the n-type pad 67a with the p-type pad 66b, and the n-type pad 67b and the p-type pad 66a are also electrically connected with each other (not shown in the figure) as shown in FIG. 7A. As shown in FIG. 7B, another embodiment would solve the bigger-volume problem that manufactured by the structure described in the U.S. Pat. No. 6,547,249 and US publication patent 2004/0075399. The bump 72 forms in the submount 68 with flip-chip structure. However, only the p-type pad 66a and N-type pad 67b connect thereon. The P-type pad 67a and N-type pad 66b connect by the conductive bridge 65. Then the leading wire 71a and 71b connect to the outer AC power source. Hence, the structure also forms oriented reversely circuit in parallel and solves the bigger-volume problem.

Figure 8:
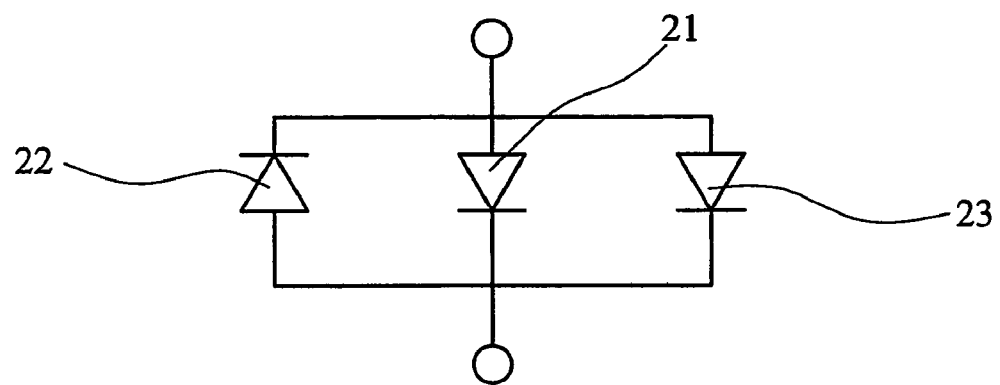
FIG. 8 is a variant of the equivalent circuit shown in FIG. 4A.

In addition, the structure of AC LED dies may be connected with a third LED micro-die 23 in parallel as shown in FIG. 8, and an asymmetric structure of AC LED dies is thus formed.

Figure 9A:
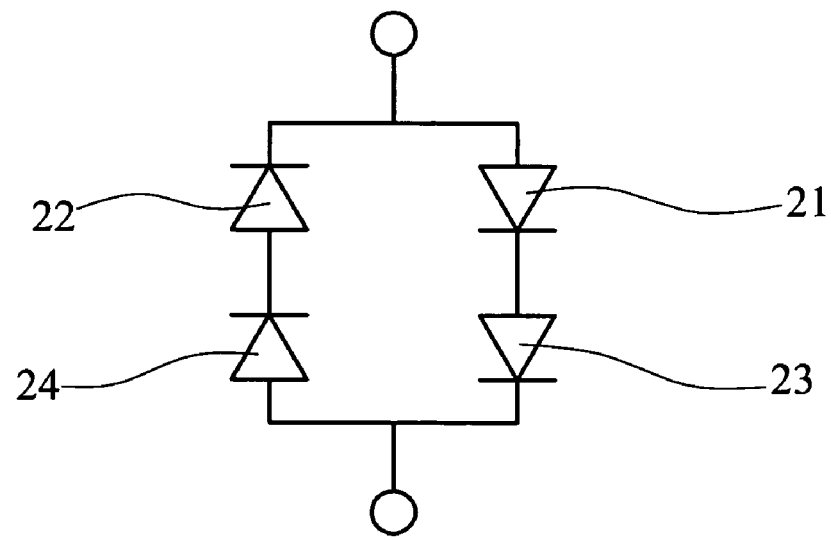
FIG. 9A is the structure of AC LED dies according to another embodiment of the invention.
Figure 9B:
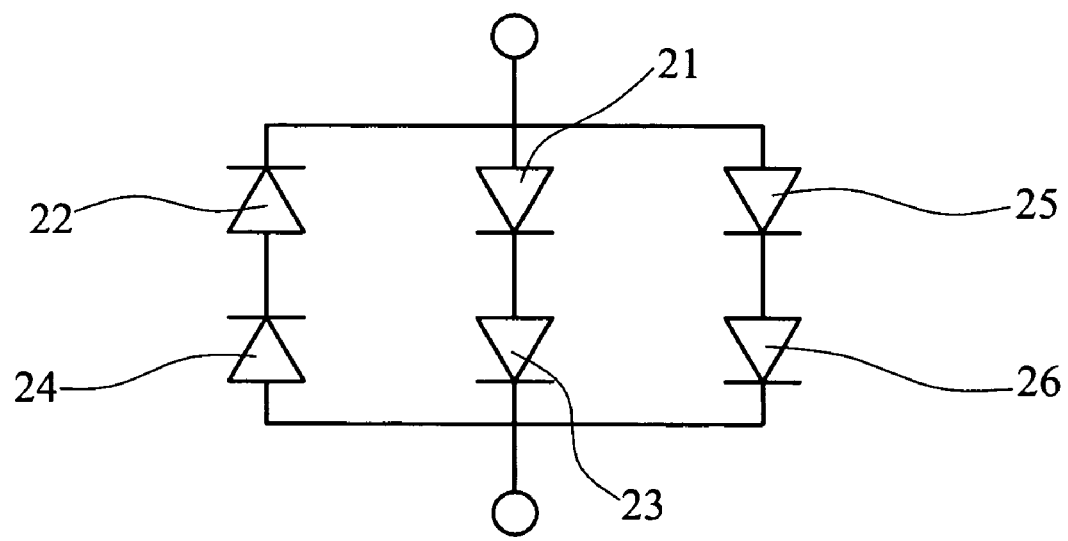
FIG. 9B is a variant of the structure of AC LED dies shown in FIG. 9A.

FIG. 9A illustrates another embodiment of the structure of AC LED dies. In this embodiment, a first LED micro-die 21 is connected with a third LED micro-die 23 and a second LED micro-die 22 is connected with a fourth LED micro-die 24, and the same result as provided by the above mentioned embodiment of the structure of AC LED dies is obtained. Alternatively, the structure of AC LED dies may be further connected with a fifth LED micro-die 25 and a sixth LED micro-die 26 in parallel, similar to that shown in FIG. 8, as shown in FIG. 9B. In the above embodiments, each of the LED micro-dies may emit light with a single wavelength or multiple wavelengths when a power supply is supplied, such as wavelengths corresponding to red, green and blue lights.

Figure 10A:
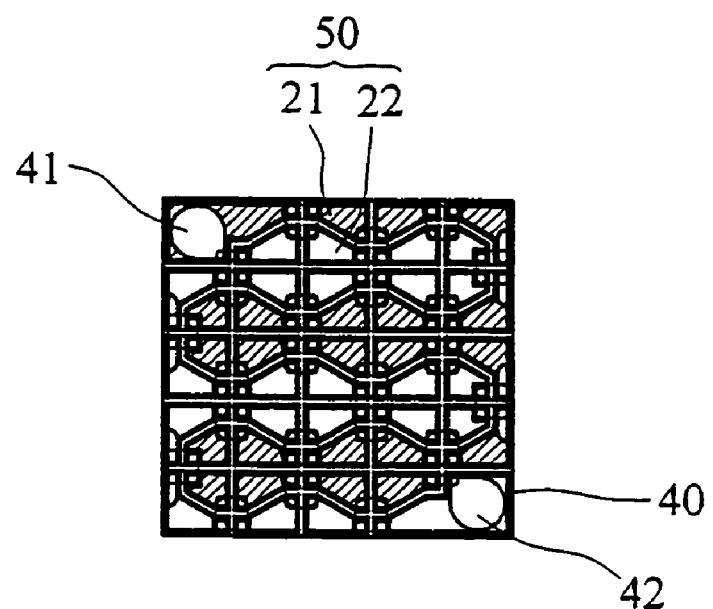
FIGS. 10A and 10B are illustrations of a plurality of structures of AC LED dies connected in a matrix form according to the invention.
Figure 10B:
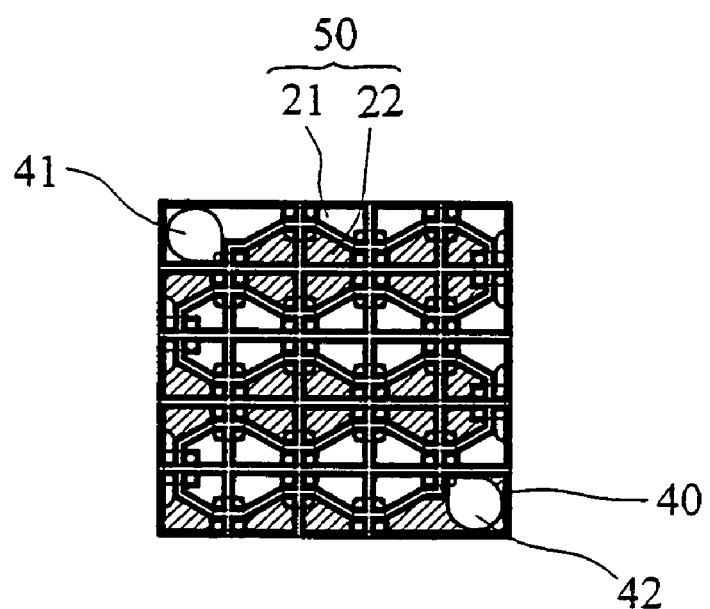
Figure 11:
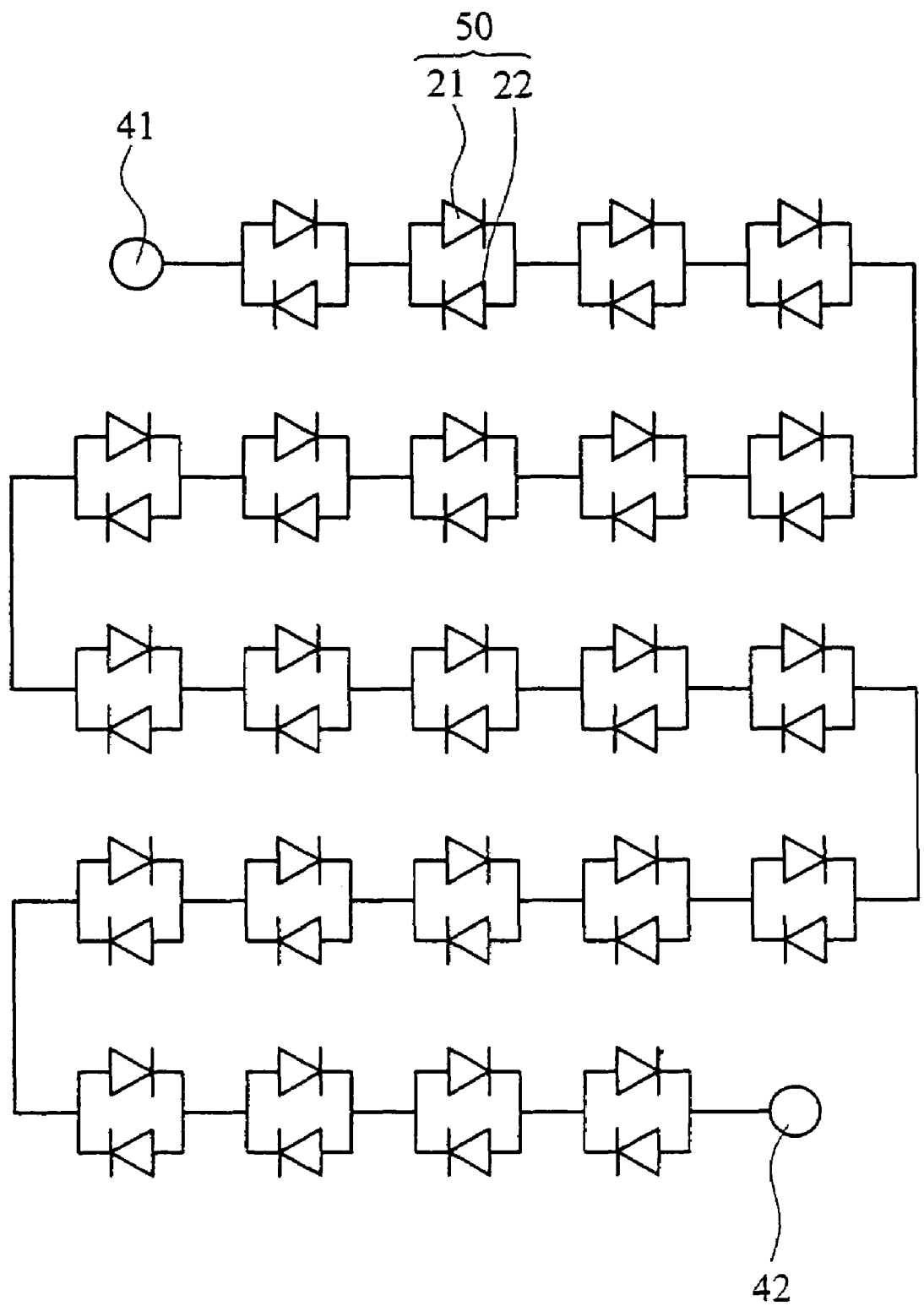
FIG. 11 is an equivalent circuit diagram of the matrix-formed plurality of structures of AC LED dies shown in FIGS. 10A and 10B.

In practical usage, a first pad 41 and a second pad 42 are formed on a substrate 40, and a plurality of units of AC LED dies 50 are coupled therebetween, as shown in FIGS. 10A and 10B. Each unit of AC LED dies 50 comprises a first LED micro-die 21 and a second LED micro-die 22, as shown in FIG. 3, and has an equivalent circuit shown in FIG. 11. Seen from FIG. 11, it may be readily known that the first and second LED micro-dies 21 and 22 are arranged in mutually reverse orientations and connected in parallel, and a plurality of thus formed units 50 is connected in series. Similar to the description in FIG. 3, the first LED micro-die 21 in the unit 50 emits light when a positive-half wave voltage is in the AC power supply, while the second LED micro-die 22 in the unit 50 emits light when a negative-half wave voltage is in the AC power supply (see FIG. 10B). Since the voltage of the AC power supply is varied between a positive peak and a negative peak with a high frequency, light emitted alternatively from the LEDs 21 and 22 is continuous. Generally, AC voltage has a large swing or a large amplitude. Even if the voltage on such a unit 50 connected at the downstream of a wire connecting a plurality of units is slightly dropped, the range of reduction is relatively small, unlike the prior art (only several volts is provided) in which slight changes over the voltage fed into the LED cause a remarkable difference of luminance of the LED. Since the LED has a fast response speed, the AC power supply may have a frequency up to 50-60 kHz. In addition, any waveform of the AC power supply may be used, provided that the waveform is symmetrical.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

The invention claimed is:

1. A structure of AC light-emitting diode (LED) dies, comprising:
   a substrate;
   two layers of a first conductivity type that are supported on the substrate and separated from each other, each of the layers of the first conductivity type having a wide end and a narrow end;
   two layers of a second conductivity type that are supported respectively on the two layers of the first conductivity type, each of the layers of the second conductivity type having a wide end and a narrow end;
   a first pad formed on one of the two layers of the first conductivity type, the first pad being disposed adjacent the narrow end of said one of the two layers of the first conductivity type;
   a second pad formed on one of the two layers of the second conductivity type, the second pad being disposed adjacent the wide end of said one of the two layers of a second conductivity type;
   a first conductive bridge that electrically connects the first pad to the second pad;

another first pad formed on the other of the two layers of the first conductivity type, the another first pad being disposed adjacent the narrow end of said other of the two layers of the first conductivity type; and another second pad formed on the other of the two layers of the second conductivity type, the another second pad being disposed adjacent the wide end of said other of the two layers of the second conductivity type;

a second conductive bridge that electrically connects the another first pad to the another second pad;

wherein the AC LED emits light substantially continuously, when the first and second conductive bridges receive AC power, in response to the positive half-cycle and the negative half-cycle of the AC power.

2. The structure as recited in claim 1, further comprising an insulating layer disposed on exposed portions of the layers of the first and second conductivity types in prevention of short-circuits between the layers and the electrical connections.

3. The structure as recited in claim 2, wherein the two layers of the second conductivity type are supported on top surfaces of the respective layers of the first conductivity type and cover portions of the top surfaces, and wherein the insulating layer is additionally disposed on portions of the top surfaces of the layers of the first conductivity type that are not covered by the two layers of the second conductivity type.

4. The structure as recited in claim 1, further comprising a heatsink disposed on the structure.

5. The structure as recited in claim 1, further comprising a submount on which the first and second pads are connected to mount the structure as a flip-chip.

6. The structure as recited in claim 1, wherein the first and second conductive bridges have lengths that are substantially the same.

* * * * *

UNITED STATES PATENT AND TRADEMARK OFFICE
CERTIFICATE OF CORRECTION

PATENT NO.        : 7,531,843 B2
APPLICATION NO.   : 10/994361
DATED             : May 12, 2009
INVENTOR(S)       : Ming-Te Lin, Fei-Chang Hwang and Chia-Tai Kuo It is certified that error appears in the above-identified patent and that said Letters Patent is hereby corrected as shown below:

Column 4, delete line 4 to line 25.
Column 5, line 9, add --in a related embodiment-- after words "LED dies".
Column 6, line 12 to 13, remove "50" from after "dies" to after "units".
Column 6, line 14, remove "50" from after "dies" to after "unit".

Signed and Sealed this
Twenty-second Day of February, 2011

David J. Kappos
*Director of the United States Patent and Trademark Office*